United States Patent
Zhou et al.

(10) Patent No.: US 11,057,007 B2
(45) Date of Patent: Jul. 6, 2021

(54) TUNING SYSTEM AND METHOD FOR AUTOMOBILE POWER AMPLIFIER

(71) Applicant: Harman Becker Automotive Systems GmbH, Karlsbad (DE)

(72) Inventors: Tingting Zhou, Suzhou (CN); Yuliu Cao, Changzhou (CN)

(73) Assignee: Harman Becker Automotive Systems GmbH

( * ) Notice: Subject to any disclaimer, the term of this patent is extended or adjusted under 35 U.S.C. 154(b) by 49 days.

(21) Appl. No.: 16/690,280

(22) Filed: Nov. 21, 2019

(65) Prior Publication Data
US 2020/0162038 A1 May 21, 2020

(30) Foreign Application Priority Data
Nov. 21, 2018 (CN) .......................... 201811392170.3

(51) Int. Cl.
| | | |
|---|---|---|
| *H03F 3/191* | (2006.01) | |
| *H03F 3/21* | (2006.01) | |
| *H03F 3/183* | (2006.01) | |
| *H03G 5/24* | (2006.01) | |

(52) U.S. Cl.
CPC .............. *H03F 3/21* (2013.01); *H03F 3/183* (2013.01); *H03G 5/24* (2013.01); *H03F 2200/03* (2013.01)

(58) Field of Classification Search
CPC ...................................................... H03F 3/191
USPC ............................................ 330/124 R, 305
See application file for complete search history.

(56) References Cited

U.S. PATENT DOCUMENTS 9,161,107 B2 * 10/2015 Ji ........................ H04L 5/0028
2017/0222829 A1    8/2017 Kessler et al.

OTHER PUBLICATIONS

Mentor Automotive "Automotive Audio Bus (A2B) 1-17 Analyzer System In-car Experience", Jun. 1, 2017 (Jun. 1, 2017), pp. 1-2, XP055663450,Technical Fields Searched (IPC) www.nentorautoniotive.com.

* cited by examiner

*Primary Examiner* — Henry Choe
(74) *Attorney, Agent, or Firm* — Angela M. Brunetti

(57) ABSTRACT

A method and system for power amplifier tuning based on an automobile audio bus (A2B) interface including determining a plurality of tuning paths and a plurality of tuning parameters of one or more power amplifiers; determining data volumes of the plurality of tuning parameters according to the type(s) of the one or more power amplifiers; determining a data volume for each tuning path according to the data volumes of the plurality of tuning parameters; allocating the number of A2B channels to each tuning path according to the data volume determined for each tuning path; calculating a tuning speed for each tuning, path according to the number of A2B channels allocated to each tuning path; and allocating the calculated tuning speed for each tuning path to the one or more power amplifiers through the A2B interface.

16 Claims, 4 Drawing Sheets

TUNING SYSTEM AND METHOD FOR AUTOMOBILE POWER AMPLIFIER

CROSS REFERENCE

Priority is claimed to application serial no. 201811392170.3, filed Nov. 21, 2018 in China, the disclosure of which is incorporated in its entirety by reference.

TECHNICAL FIELD

The present invention relates to the field of automobile power amplifier tuning, and in particular, to a system and a method for automobile power amplifier tuning based on an automobile audio bus (A2B) interface.

BACKGROUND

At present, with the continuous development of product integration, it is necessary to tune an automobile power amplifier before it is put into use, to achieve an optimal power amplifier effect. An existing tuning system generally includes a tuning control device and a single automobile power amplifier (briefly referred to as a power amplifier hereinafter) connected to the tuning control device through a USB-Uart interface. The existing power amplifier has a microcontroller unit (MCU) and at least one digital signal processor (DSP). The MCU processes some control signals and sends the signals to the DSP for audio processing. The audio processing includes many technologies and algorithms, such as an equalizer, a QLS, an EOC, an iESS, an RNC, a Virtual Venus, and so on. These technologies and algorithms include many parameters, and different parameter settings will lead to different algorithm performance. These parameters can be configured by the timing control device, and the parameter configurations are sent to the power amplifier to evaluate the algorithm performance. At the same time, the power amplifier may also send many feedback parameters to the tuning control device. A tuning detection device estimates the algorithm performance according to these feedback parameters to further tune the parameters until optimal parameters for the power amplifier and optimal performance of the power amplifier are obtained.

FIG. 1 and FIG. 2 illustrate two common existing tuning systems. The tuning system as shown in FIG. 1 includes a tuning control device and a power amplifier. The power amplifier includes an MCU and a DSP. In the power amplifier illustrated in FIG. 1, since the DSP docs not have a UART interface, the power amplifier can only be connected to the tuning control device through a UART interface of the MCU. The tuning control device sends tuning configuration parameters to the MCU through the UART interface. The MCU then sends, through an SPI interface, tuning data to the DSP for audio processing. The DSP can also send feedback parameters to the MCU through the SPI interface. The MCU then sends the feedback parameters to the tuning control device through the UART interface. In this ease, the speed of the UART of the MCU used in the power amplifier is usually 115.2 Kbit/s. The speed of the UART of the MCU can be up to 460.8 Kbit/s in some more advanced power amplifiers.

In the tuning system shown in FIG. 2, the DSP of the power amplifier has a UART interface, so the UART interface of the DSP can be directly used. Data is transmitted faster through the UART interface of the DSP than through the UART interface of the MCU. In the tuning system shown in FIG. 2, the tuning control device directly sends tuning parameters to the DSP through the UART interface, and the DSP can directly send feedback parameters to the tuning control device through the UART interface. In this case, the speed of the UART of the DSP used in the power amplifier can be up to 6.144 Mbit/s.

However, as the audio processing algorithm used in the power amplifier becomes increasingly more complex, the existing tuning system using the UART interface cannot meet the requirements on the data transmission speed. Especially for the DSP without a UART interface, the speed of a UART of a low-power MCU will no longer meet the requirements. A too long data transmission time between the tuning control device and the power amplifier will lead to an over-high time cost and even affect the performance evaluation of some algorithms with higher real-time performance requirements. By taking the RNC algorithm as an example, the tuning control device needs to obtain calculation parameters fed back in real lime from the power amplifier, such as obtaining a W filter coefficient in real time as much as possible. The tuning control device terminal can better evaluate the algorithm performance with the feedback parameters. Therefore, a higher transmission speed is required for parameters with higher real-time performance requirements.

In addition, as a result of ever-increasing demands of users for stereo sound functions and stereo sound effects, the single power amplifier has been incapable of meeting the demands of the users. Therefore, further consideration is given to a plurality of amplifiers working coordinated to meet the demands, which will require the transmission of more tuning parameter data. Moreover, since only a single power amplifier is used and the tuning control device and the power amplifier are connected using a UART interface in the existing tuning system, this configuration can only transmit data at a fixed transmission speed, but cannot transmit the data at different transmission speeds for parameters w with different real-time performance requirements, thus leading to a waste of system resources and low efficiency.

Therefore, it is necessary to develop a new tuning system which can transmit data quickly and configure system resources flexibly.

SUMMARY

A method for power amplifier tuning based on an automobile audio bus (A2B) interface is provided in an embodiment of the present invention, comprising: determining a plurality of tuning paths and a plurality of tuning parameters of one or more power amplifiers; determining data volumes of the plurality of tuning parameters according to the type(s) of the one or more power amplifiers; determining a data volume for each timing path according to the data volumes of the plurality of tuning parameters; allocating the number of A2B channels to each tuning path according to the data volume determined for each tuning path; calculating a tuning speed for each tuning path according to the number of A2B channels allocated to each tuning path; and allocating the calculated tuning speed for each tuning path to the one or more power amplifiers through the A2B interface.

A system for power amplifier tuning based on an automobile audio bus (A2B) interface is provided in another embodiment of the present invention, comprising: a tuning control device; one or more power amplifiers; and an A2B converter connected between the tuning control device and the one or more power amplifiers, wherein the tuning control device is configured to determine a plurality of tuning paths and a plurality of tuning parameters of one or more power amplifiers; determine data volumes of the plurality of tuning parameters according to the type(s) of the one or more power amplifiers; determine a data volume for each tuning path according to the data volumes of the plurality of tuning parameters; allocate the number of A2B channels to each tuning path according to the data volume determined for each tuning path; calculate a tuning speed for each tuning path according to the number of A2B channels allocated to each tuning path; and allocate the calculated tuning speed for each tuning path to the one or more power amplifiers through the A2B interface.

A computer readable medium configured to perform the steps of the above method is provided in still another embodiment of the present invention.

Advantageously, the tuning system and the tuning method disclosed in the present invention can ensure rapid transmission of data and can more flexibly configure and utilize system resources.

DESCRIPTION OF THE DRAWINGS

The system can be better understood with reference to the following description and in combination with the accompanying drawings. The parts in the drawings are not necessarily proportional, but rather focus on explaining the principles of the present invention. In addition, similar or identical reference numerals in the drawings refer to similar or identical elements.

DETAILED DESCRIPTION

It should be appreciated that the following description of embodiments is given only for illustrative purposes but is not restrictive. The division of an example in functional blocks, modules or, units as shown in the accompanying drawings shall not be interpreted to represent that such functional blocks, modules, or units must be implemented as physically separate units. The functional blocks, modules, or units shown or described may be implemented as separate units, circuits, chips, functions, modules, or circuit elements. One or more functional blocks or units may also be implemented in a common circuit, chip, circuit element or, unit.

Figure 1:
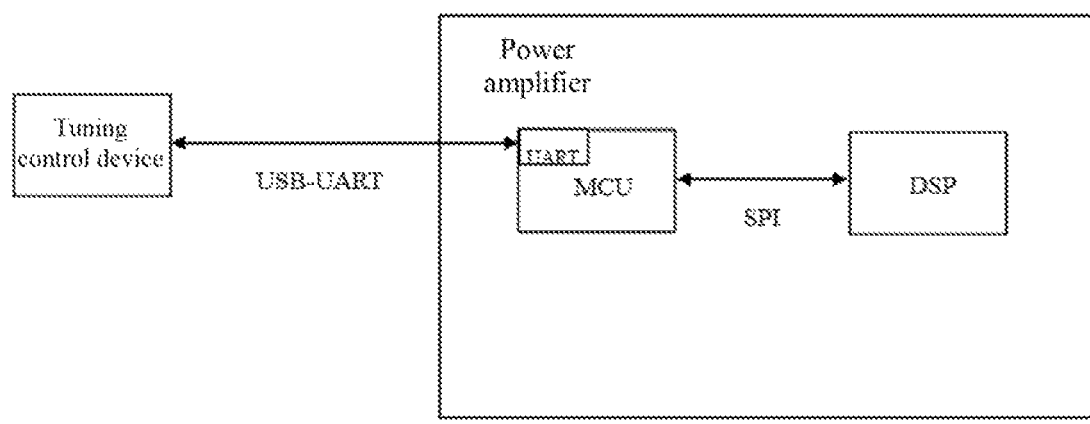
FIG. 1 is a schematic diagram of an existing tuning system.
Figure 2:
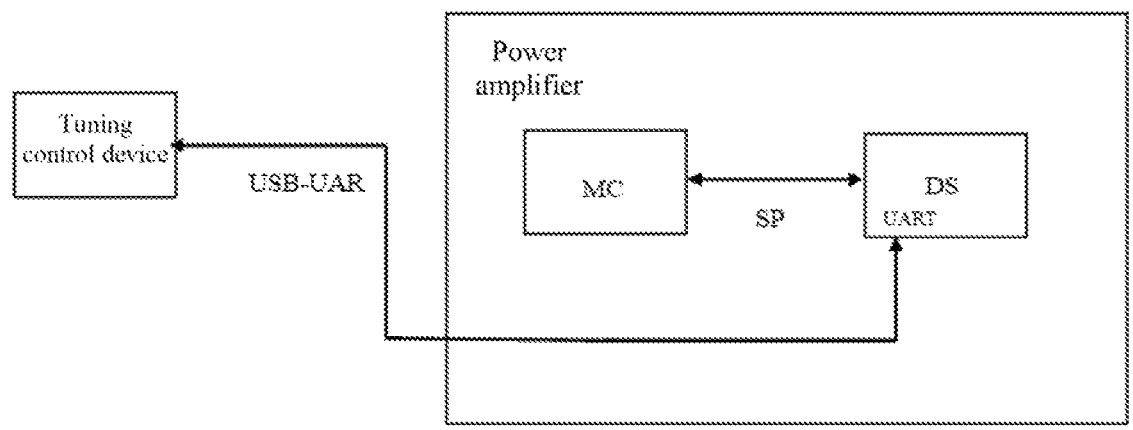
FIG. 2 is a schematic diagram of another existing tuning system.
Figure 3:
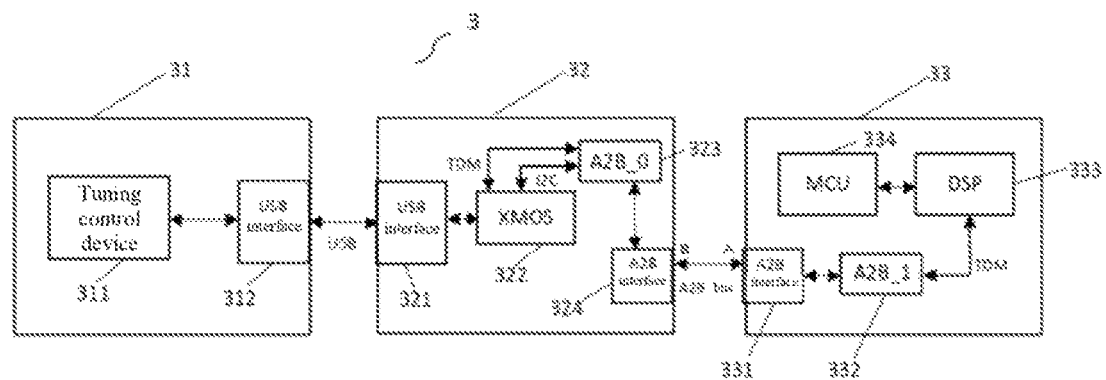
FIG. 3 is a schematic diagram of a tuning system according to an embodiment of the present invention.

FIG. 3 is a schematic diagram of a tuning system according to an embodiment of the present invention. The tuning system 3 includes a tuning control device 31, a USB-A2B converter 32, and a power amplifier 33. The tuning control device 31 includes a tuning module 311 and a USB interface module 312. The tuning module 311 sends timing parameter data to the USB-A2B converter 32 through the USB interface module 312. For example, the tuning parameter data may include a power amplifier tuning number, a downlink data speed (data download speed), an uplink data speed (a data obtaining speed or a data feedback speed), and so on.

The USB-A2B converter 32 includes a USB interface module 321, XMOS module 322, an A2B data transmission module (A2_0) 323, and an A2B interface module 324. The USB-A2B converter 32 receives the tuning parameter data from the tuning control device 31 through the USB interface module 321, and transmits the received tuning parameter data to the XMOS module 322. The XMOS module 322 configures all A2Bs (for example A2_B0 and A2B_1) in an A2B bus through an I2C interface according to configuration information in the tuning parameter data. In addition, the XMOS module 322 transmits the tuning parameter data to the A2B data transmission module 323 through a TDM interface. Then, the A2B data transmission module 323 transmits the tuning parameter data to the power amplifier 33 through the A2B interface module 324.

The power amplifier 33 includes an A2B interface module 331, an A2B data transmission module (A2B_1) 332, a processor (DSP) 333, and a microcontroller unit (MCU) module 334. The power amplifier 33 receives the tuning parameter data from the USB-A2B converter 32 through the A2B interface module 331, and transmits the tuning parameter data to the A2B data transmission module (A2B_1) 332. The A2B data transmission module (A2B_1) 332 finally sends the tuning parameter data to the DSP 333 through the TDM interface to enable the DSP 333 to perform audio processing according to the configuration of the tuning parameters. As shown in the figure, the A2B interface module 331 on the side of the power amplifier 33 and the A2B interface module 324 on the side of the USB-A2B converter 32 are connected through the A2B bus. For example, each A2B interface has two ports, which can be referred to as a port B and a port A for ease of description. In this embodiment, the port A of the A2B interface module 331 on the side of the power amplifier 33 is connected to the port B of the A2B interface module 324 on the side of the USB-A2B converter 32 through the A2B bus. Those skilled in the art can understand that A and B are used here only for the convenience of description and are not intended to make further limitations, and they are interchangeable.

In addition, the DSP 333 can send the feedback parameters to the A2B data transmission module (A2B_1) 332 through the TDM interface, and the A2B data transmission module 332 can send the feedback parameters to the A2B data transmission module (A2B_0) 323 of the USB-A2B converter 32 through the A2B interface module 331 on the side of the power amplifier 33 and the A2B interface module 324 on the side of the USB-A2B converter 32. The A2B data transmission module (A2B_0) 323 of the USB-A2B converter 32 sends the feedback parameters to the XMOS module 322 through the TDM interface. The XMOS module 322 transmits the feedback parameters to the timing module 311 through the USB interface module 322 on the side of the USB-A2B converter and the USB interface module 312 on the side of the tuning control device. The tuning module 311 adjusts the various tuning parameters according to the feedback parameters and sends them to the power amplifier again according to the above process, and the process is repeated until the optimal power amplifier effect is achieved.

Figure 4:
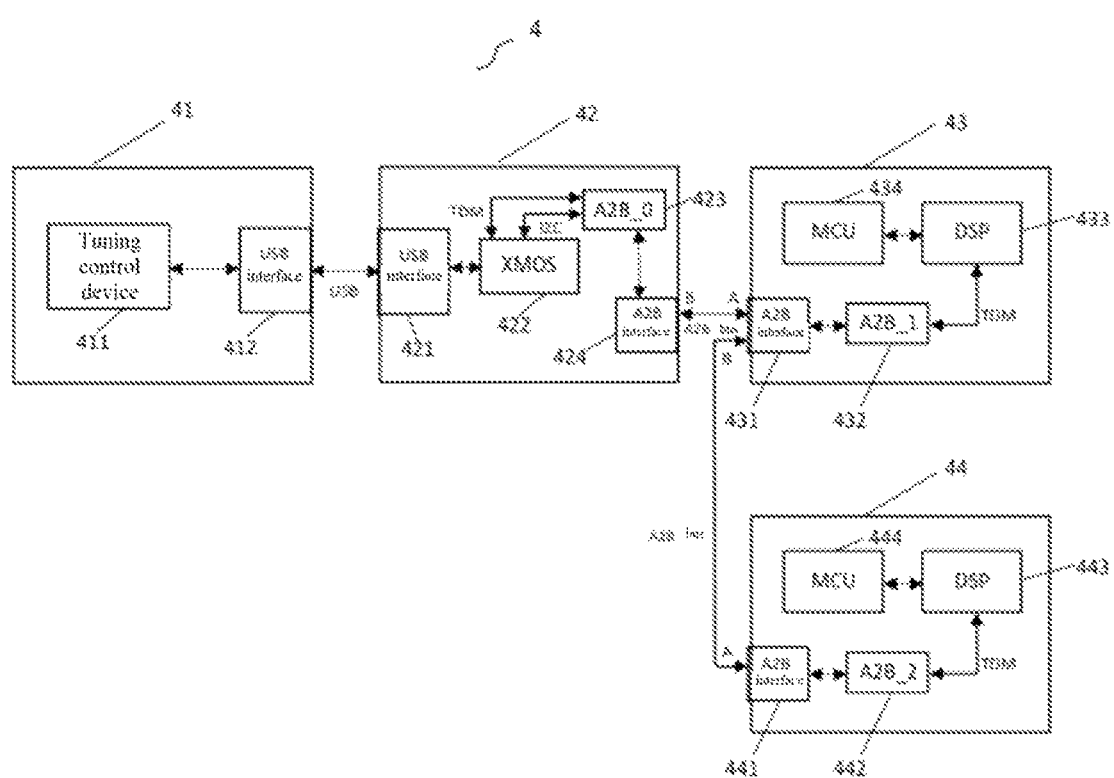
FIG. 4 is a schematic diagram of a tuning system according to another embodiment of the present invention.

FIG. 4 is a schematic diagram of a tuning system including a plurality of power amplifiers according to another embodiment of the present invention. Although the tuning system illustrated in FIG. 4 includes two power amplifiers, those skilled in the art can understand that FIG. 4 is merely an illustration, and the tuning system can include a plurality of power amplifiers depending on the demands of the users.

Similar to the tuning system 3, the tunings system 4 includes a tunings control deice 41 and a USB-A2B converter 42. The tuning system 4 also includes a first power amplifier 43 and a second power amplifier 44. The tuning control device 41 includes a tuning module 411 and a USB interface module 412. The tuning module 411 sends a plurality of tuning parameters to the USB-A2B converter 42 through the USB interface module 412.

The USB-A2B converter 42 includes a USB interface module 421, an XMOS module 422, an A2B data transmission module (A2B_0) 423, and an A2B interface module 424. The USB-A2B converter 42 receives a plurality of pieces of tuning parameter data from the tuning control device 41 through the USB interface module 421, and transmits the received tuning parameter data to the XMOS module 422. The XMOS module 422 can configure all A2Bs (for example, A2B_0, A2B_1 and A2B_2) in an A2B bus through an I2C interface according to configuration information in the tuning parameter data. Moreover, the XMOS module 422 transmits the tuning parameter data to A2B data transmission module 423 through the TDM interface. Then, the A2B data transmission module 423 transmits the tuning parameter data to the first power amplifier 43 through the A2B interface module 424.

The first power amplifier 43 includes a first A2B interface module 431, a first A2B data transmission module (A2B_1) 432, a first processor (DSP) 433, and a first microcontroller unit (MCU) module 434. The first power amplifier 43 receives the tuning parameter data from the USB-A2B converter 42 through the first A2B interface module 431. For example, the A2B data transmission module 423 transmits the tuning parameter data to the first A2B data transmission module (A2B_1) 432 through the A2B interface module 424 and the first A2B interface module 431. The first A2B data transmission module (A2B_1) 432 finally sends the tuning parameter data belonging to the first power amplifier 43 to the first DSP 433 through the TDM interface, so that the DSP 433 can perform audio processing according to the tuning parameters.

The configuration of the second power amplifier 44 is similar to that of the first power amplifier 43. The second power amplifier 44 includes a second A2B interface module 441, a second A2B data transmission module (A2B 1) 442, a second processor (DSP) 443, and a second microcontroller unit (MCU) module 444. The working principle of the second power amplifier 44 is similar to that of the first power amplifier 43. Therefore, the working process of the same part is no longer described in detail. As shown in the figure, the A2B interface module 431 on the side of the first power amplifier 43 and the A2B interface module 424 on the side of the USB-A2B converter 42 are connected through the A2B bus. For example, each A2B interface has two ports, which can be referred to as a port A and a port B for case of description. For example, the port A of the A2B interface module 431 on the side of the first power amplifier 43 is connected to the port B of the A2B interface module 424 on the side of the USB-A2B converter 42 through the A2B bus. The port B of the A2B interface module 431 on the side of the first power amplifier 43 is connected to the port A of the A2B interface module 441 on the side of the second power amplifier 44 through the bus. In this way, the USB-A2B converter can be connected to a plurality of power amplifiers through the A2B bus. Those skilled in the art can understand that A and B are used here only for the convenience of description and are not intended to make further limitations, and they are interchangeable.

The method for allocating the tuning speed to different tuning paths in the tuning system according to the present invention is further introduced in the following with reference to the tuning system in FIG. 3 and FIG. 4. According to the methods provided in the various embodiments of the present invention, the tuning speeds of the various tuning paths can be adjusted based on different requirements of different automobile power amplifiers in the tuning system for specific tuning parameters, to achieve the most reasonable use of the tuning speed of each path.

In an embodiment, for example, in a tuning system that includes only one power amplifier as shown in FIG. 3, two paths can be defined. One path is a path where the data is sent from the tuning control device 31 to the power amplifier 33, which can be referred to as a downlink tuning path (Path 1). The other path is a path where the data is sent from the power amplifier 33 to the tuning control device 31, which can be referred to as an uplink tuning path (Path 2).

For example, the maximum toning speed of the system can be calculated according to the following formula:

$$TS\_Max = A2B\_CH\_MAX \times A2B\_CH\_BIT \times fs = 28 \times 32 \times 48000 = 43.008 \text{ Mbit/s}$$

where A2_B_CH_MAX denotes the maximum number of channels of the A2B bus in the tuning system, A2B_CH_BIT denotes the number of bits of each channel, and fs denotes the sampling rate of the A2B bus.

In addition, the minimum tuning speed of the system can be calculated according to the following formula:

$$TS\_Min = A2B\_CH\_MIN \times A2B\_CH\_BIT \times fs = 1 \times 32 \times 48000 = 1.536 \text{ Mbit/s}$$

where A2B_CH_MIN denotes the minimum number of channels of the A2B bus in the tuning system, A2B_CH_BIT denotes the number of bits of each channel, and fs denotes the sampling rate of the A2B bus.

In actual use, different power amplifier types may require different parameters, even for the same power amplifier, the parameters required may also be different due to different algorithms that need to be tested and adjusted. These different parameters may have different requirements on the real-time performance. In addition, data volumes of parameters to be transmitted in the uplink path and the downlink path may also be different according to the requirements.

In an embodiment of the present invention, according to the type of a specific power amplifier, statistics can be conducted on data volumes (for example, in bits) of tuning parameters required by the power amplifier to determine data volumes on different tuning paths. For example, in the above tuning system which includes only one power amplifier, calculation results of the data volumes on the uplink tuning path and the downlink tuning path are as follows:

Path1 (downlink tuning path): $x_1$ Kbit
Path2 (uplink tuning path); $x_2$ Kbit

Then, the number of uplink A2B channels and the number of downlink A2B channels required on the uplink tuning path and the downlink tuning path respectively can be allocated proportionally based on the calculated data volumes of the tuning paths.

$$P1\_A2B\_CH = \text{floor}\left(A2B\_CH\_MAX \times \frac{x_1}{x_1 + x_2}\right) \quad \text{Path 1}$$

$$P2\_A2B\_CH = \text{floor}\left(A2B\_CH\_MAX \times \frac{x_2}{x_1 + x_2}\right) \quad \text{Path 2}$$

where P1_A2B_CH denotes the number of channels allocated to the downlink tuning path, P2_A2B_CH denotes the number of channels allocated to the uplink tuning path, and A2B_CH_MAX denotes the maxmimum number of channels of the A2B bus in the tuning system; floor(x) denotes a function rounding x off, for example, floor(2.3)=2 and floor(2.6)=2.

Next, an uplink tuning speed of the uplink tuning path and a downlink tuning speed of the downlink tuning path are calculated based on the number of uplink A2B channels and the number of downlink A2B channels allocated to the uplink tuning path and the downlink tuning path respectively, as shown in the following formulas:

Path1: $P1\_TS\_USE = P1\_A2B\_CH \times A2B\_CH\_BIT \times fs$

Path2: $P2\_TS\_USE = P2\_A2B\_CH \times A2B\_CH\_BIT \times fs$ where A2B_CH_BIT denotes the number of bits of each channel, fs denotes the sampling rate of the A2B bus, P1_TS_USE denotes the downlink tuning speed of the downlink tuning path, and P2_TS_USE denotes the uplink tuning speed of the uplink tuning path.

Table 1 illustrates various combinations of the tuning speeds allocated to the uplink tuning path and the downlink tuning path of the tuning system including only one power amplifier when the maximum tuning speed of the system is calculated as 43.008 Mbit/s.

TABLE I

| Combination | Downlink tuning speed | Uplink tuning speed | Total speed |
|---|---|---|---|
| 1 | 43.008 Mbit/s | 0 Mbit/s | 43.008 Mbit/s |
| 2 | 41.472 Mbit/s | 1.536 Mbit/s | 43.008 Mbit/s |
| 3 | 39.936 Mbit/s | 3.072 Mbit/s | 43.008 Mbit/s |
| ... | ... | ... | ... |
| 27 | 3.072 Mbit/s | 39.936 Mbit/s | 43.008 Mbit/s |
| 28 | 1.536 Mbit/s | 41.472 Mbit/s | 43.008 Mbit/s |
| 29 | 0 Mbit/s | 43.008 Mbit/s | 43.008 Mbit/s |

Preferably, the allocation of the number of A2B channels of the tuning paths can also be adjusted before the uplink tuning speed of the uplink tuning path and the downlink tuning speed of the downlink tuning path are calculated based on the number of uplink A2B channels and the number of downlink A2B channels allocated to the uplink tuning path and the downlink tuning path respectively. In general, the adjusting includes adding, based on different real-time performance requirements of the tuning parameters, the number of the A2B channels remained after the allocation to the tuning path where the tuning parameters have higher real-time performance requirements. Specifically, different priorities can be determined for a plurality of parameters according to real-time performance of the plurality of parameters, thereby determining the priorities of the tuning paths for transmission of the parameters. Then, the sum of the numbers of allocated A2B channels is further calculated.

For example, in the embodiment where the above tuning system includes only one power amplifier, the sum of the numbers of allocated A2B channels is calculated according to the following formula:

$P\_A2B\_CH_{allocated} = P1\_A2B\_CH + P2\_A2B\_CH$

For example, P_A2B_CH_allocated denotes the sum of the numbers of allocated A2B channels, P1_A2B_CH denotes the number of channels allocated to the downlink tuning path (Path1 and P2_A2B_CH denotes the number of channels allocated to the uplink tuning path (Path2).

Next, it is judged whether the sum of the numbers of allocated A2B channels is less than or equal to the maximum number of channels of the A2B bus (A2V_CH_MAX) in the tuning system. If the sum of the numbers of allocated A2B channels is equal to the maximum number of channels of the A2B bus in the tuning system (i.e., P_A2B_CH_allocated=A2B_CH_MAX), the numbers of channels are not adjusted. If the sum of the numbers of allocated A2B channels is less than the maximum number of channels of the A2B bus in the tuning system (i.e., P_A2B_CH_allocated<A2B_CH_MAX), the number of unused A2B channels A2B_CH_MAX-P_A2B_CH_allocated) is calculated. A part or all of the number of unused A2B channels is added to the corresponding number of A2B channels of the tuning path with a higher real-time performance priority according to the real-time performance priorities of the timing parameters of the uplink tuning path and the downlink path of the power amplifier, to obtain the adjusted number of downlink A2B channels (for example, P1_A2B_CH_USE) and the adjusted number of uplink A2B channels (for example, P2_A2B_CH_USE).

Actual tuning speeds of the various tuning paths can be calculated as follows according to the adjusted number of uplink A2B channels and the adjusted number of downlink A2B channels of the tuning path:

$P1\_TS\_USE = P1\_A2B\_CH\_USE \times A2B\_CH\_BIT \times fs$ $P2\_TS\_USE = P2\_A2B\_CH\_USE \times A2B\_CH\_BIT \times fs$ where P1_TS_USE and P2_TS_USE denote, for example, the tuning speeds of the downlink path and the uplink path respectively. It should be appreciated that the uplink path and the downlink path mentioned in the calculation of the tuning, speeds in this embodiment are only illustrative for understanding.

In another embodiment, for example, four paths can be defined in the tuning system including two power amplifiers shown in FIG. 4: a path for transmitting data from the tuning control device 41 to the power amplifier 43 can be referred to as a first downlink tuning path (Path 1); a path for transmitting data from the tuning control device 41 to the power amplifier 44 can be referred to as a second downlink tuning path (Path 2); a path for transmitting data from the power amplifier 43 to the tuning control device 41 can be referred to as a first uplink tuning path (Path 3); and a path for transmitting data from the power amplifier 44 to the lining control device 41 can be referred to as a second uplink tuning path (Path 4).

For example, the maximum tuning speed of the system can be calculated according to the following in formula:

$TS\_MAX = A2B\_CH\_MAX \times A2B\_CH\_BIT \times fs = 28 \times 32 \times 48000 = 43.008$ Mbit/s where A2B_CH_MAX denotes the maximum number of channels of the A2B bus in the tuning system, A2B_CH_BIT denotes the number of bits of each channel, and fs denotes the sampling rate of the A2B bus.

In addition, the minimum tuning speed of the system can be calculated according to the following formula:

$TS\_Min = A2B\_CH\_MIN \times A2B\_CH\_BIT \times fs = 1 \times 32 \times 48000 = 1.536$ Mbit/s where A2B_CH_MIN denotes the minimum number of channels of the A2B bus in the tuning system, A2B_CH_BIT denotes the number of bits of each channel, and fs denotes the sampling rate of the A2B bus.

In another embodiment of the present invention, according to the type of a specific power amplifier, statistics can be conducted on data volumes (for example, in bits) of tuning parameters required by the power amplifier to determine data volumes on different tuning paths. For example, the tuning system in this embodiment includes two power amplifiers, and calculation results of the data volumes on different tuning paths are as follows:

Path1 (first downlink tuning path for the first power amplifier 43): $x_1$ Kbit

Path2 (second downlink tuning path for the second power amplifier 44): $x_2$ Kbit Path3 (first uplink tuning path for the first power amplifier 43): $x_3$ Kbit Path4 (second uplink tuning path for the second power amplifier 44): $x_4$ Kbit Next, the numbers of A2B channels required on various tuning paths of different power amplifiers are allocated proportionally based on the calculated data volumes of the various tuning paths.

$$P1\_A2B\_CH = \text{floor}\left(A2B\_CH\_MAX \times \frac{x_1}{x_1 + x_2 + x_3 + x_4}\right) \quad \text{Path 1}$$

$$P2\_A2B\_CH = \text{floor}\left(A2B\_CH\_MAX \times \frac{x_2}{x_1 + x_2 + x_3 + x_4}\right) \quad \text{Path 2}$$

$$P3\_A2B\_CH = \text{floor}\left(A2B\_CH\_MAX \times \frac{x_3}{x_1 + x_2 + x_3 + x_4}\right) \quad \text{Path 3}$$

$$P4\_A2B\_CH = \text{floor}\left(A2B\_CH\_MAX \times \frac{x_4}{x_1 + x_2 + x_3 + x_4}\right) \quad \text{Path 4}$$

where, for example, P1_A2B_CH denotes the number of channels allocated to the first downlink tuning path (Path 1) of the first power amplifier 43, P2_A2B_CH denotes the number of channels allocated to the second downlink tuning path (Path 2) of the second power amplifier 44, P3_A2B_CH denotes the number of channels allocated to the first uplink tuning path (Path 3) of the first power amplifier 43, P4_A2B_CH denotes the number of channels allocated to the second uplink tuning path (Path 4) of the second power amplifier 44, A2B_CH_MAX denotes the maximum number of channels of the A2B bus in the tuning system; and floor(x) denotes a function rounding x off, for example, floor(2.3)=2 and floor(2.6)=2.

How to use different channels for different power amplifiers is described in the following through examples. For example, it is assumed that a total of 8 channels are allocated to the two power amplifiers in the downlink direction, wherein 3 channels are allocated to the first power amplifier and 5 channels are allocated to the second power amplifier. Then, the parameters for the first power amplifier can be transmitted using the channels 1-3, and the parameters for the second power amplifier can be transmitted using the channels 4-8. In other words, the downlink data is allocated according to a positive order of the channels. On the contrary, it is assumed that a total of 21 channels are allocated to the two power amplifiers in the uplink direction, wherein 11 channels are allocated to the first power amplifier and 10 channels are allocated to the second power amplifier. Then, parameter data of the second power amplifier can be transmitted through the channels 1-10, while the data of the first power amplifier can be transmitted through the channels 11-21. In other words, the uplink data is allocated according to a reverse order of the channels. The data of the last power amplifier is allocated at first, and the rest are allocated in such sequence.

Next, the tuning speeds of data transmission on the various tuning paths are calculated based on the numbers of A2B channels allocated to various tuning paths, referring to the following formulas:

Path1—$P1\_TS\_USE = P1\_A2B\_CH \times A2B\_CH\_BIT \times fs$

Path2—$P2\_TS\_USE = P2\_A2B\_CH \times A2B\_CH\_BIT \times fs$

Path3—$P3\_TS\_USE = P3\_A2B\_CH \times A2B\_CH\_BIT \times fs$

Path4—$P4\_TS\_USE = P4\_A2B\_CH \times A2B\_CH\_BIT \times fs$ where A2B_CH_BIT denotes the number of bits of each channel, fs denotes the sampling rate of the A2B bus, P1_TS_USE denotes the first downlink tuning speed of the first downlink tuning path, P2_TS_USE denotes the second downlink tuning speed of the second downlink tuning path, P3_TS_USE denotes the first uplink tuning speed of the first uplink tuning path, and P4_TS_USE denotes the second uplink tuning speed of the second uplink tuning path.

Table 2 illustrates three combinations of the tuning speeds allocated to the tuning paths of the tuning system including two power amplifiers when the maximum tuning speed of the system is calculated as 43.008 Mbit/s.

TABLE 2

| Com-bination | First downlink tuning speed | Second downlink tuning speed | First uplink tuning speed | Second uplink tuning speed | Total speed |
|---|---|---|---|---|---|
| 1 | 6.144 Mbit/s | 6.144 Mbit/s | 15.36 Mbit/s | 15.36 Mbit/s | 43.008 Mbit/s |
| 2 | 10.752 Mbit/s | 10.752 Mbit/s | 10.752 Mbit/s | 10.752 Mbit/s | 43.008 Mbit/s |
| 3 | 18.432 Mbit/s | 18.432 Mbit/s | 3.072 Mbit/s | 3.072 Mbit/s | 43.008 Mbit/s |

Preferably, the allocation of the number of A2B channels of the various tuning paths can also be adjusted before the tuning speeds of the tuning paths are calculated based on the number of A2B channels allocated to the various tuning paths respectively. In general, the adjusting includes adding, based on different real-time performance requirements of a user on tuning parameters of different functions on different power amplifiers or on tuning parameters of different functions on the same power amplifier, the number of the A2B channels remained after the allocation to the tuning path where the parameters have higher real-time performance requirements. Specifically, different priorities can be determined for a plurality of parameters according to real-time performance of the parameters, thereby determining the priorities of the tuning paths for transmission of the parameters.

Next, the adjusting may further include calculating the sum of the numbers of allocated A2B channels.

For example, the sum of the numbers of allocated A2B channels is calculated according to the following formula in the embodiment where the above tuning system includes only two power amplifiers:

$P\_A2B\_CH\_\text{allocated} = P1\_A2B\_CH + P2\_A2B\_CH + P3\_A2B\_CH + P4\_A2B\_CH$ where P_A2B_CH_allocated denotes the sum of the numbers of the allocated A2B channels, P1_A2B_CH denotes the number of channels allocated to the first downlink tuning path (Path 1), P2_A2B_CH denotes the number of channels allocated to the second downlink tuning path (Path 2), P3_A2B_CH denotes the number of channels allocated to the first uplink tuning path (Path 3), and P4_A2B_CH denotes the number of channels allocated to the second uplink tuning path (Path 4).

It is judged whether the sum of the numbers of the allocated A2B channels is equal to the maximum number of channels of the A2B bus in the tuning system. If the sum of the numbers of the allocated A2B channels is equal to the maximum number of channels of the A2B bus in the tuning system (that is, P_A2B_CH-allocated=A2B_CHMAX), the numbers of channels are not adjusted. If the sum of the numbers of the allocated A2B channels is less than the maximum number of channels of the A2B bus in the tuning system (that is, P_A2B_CH_allocated<A2B_CH_MAX), the number of unused A2B channels (that is, A2B_CH_MAX-P_A2B_CH_allocated) is calculated. A part or all of the number of unused A2B channels is added to the corresponding number of A2B channels of the tuning path with a higher real-time performance priority according to the real-time performance priorities of the tuning parameters of the various tuning paths of the power amplifiers, to obtain the adjusted numbers of A2B channels (for example, P1_A2B_CH_USE, P2_A2B_CH_USE, P3_A2B_CH_USE, and P4_A2B_CH_USE).

Figure 5:
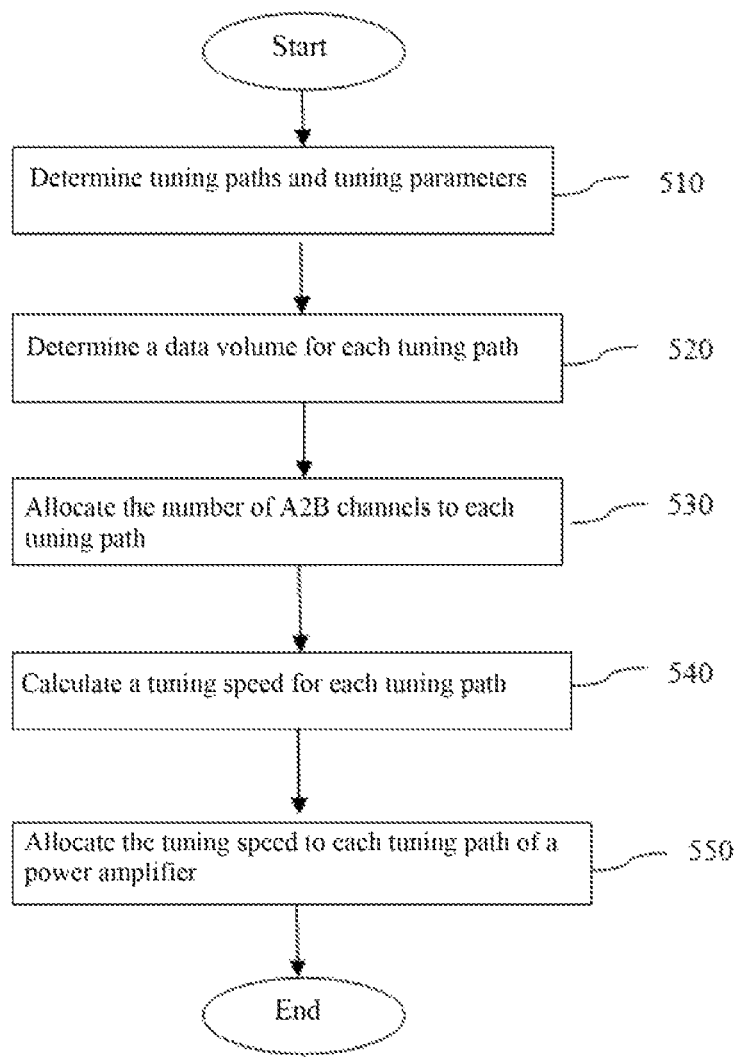
FIG. 5 is a flowchart of a method applicable to a tuning system according to various embodiments of the present invention.

Actual tuning, speeds of the various tuning paths can be calculated as follows according to the adjusted numbers of A2B channels of the various tuning paths:

$$P1\_TS\_USE = P1\_A2B\_CH\_USE \times A2B\_CH\_BIT \times fs$$

$$P2\_TS\_USE = P2\_A2B\_CH\_USE \times A2B\_CH\_BIT \times fs$$

$$P3\_TS\_USE = P3\_A2B\_CH\_USE \times A2B\_CH\_BIT \times fs$$

$$P4\_TS\_USE = P4\_A2B\_CH\_USE \times A2B\_CH\_BIT \times fs$$

where P1_TS_USE, P2_TS_USE, P3_TS_USE, and P4_TS_USE denote, for example, tuning speeds of the first downlink tuning path, the second downlink tuning path, the first uplink tuning path, and the second uplink tuning path respectively, it could be appreciated that the uplink paths and the downlink paths mentioned in the calculation of the tuning speeds in this embodiment are only illustrative for understanding. In addition, it could be appreciated that although merely a tuning system including two power amplifiers is illustrated in this embodiment through examples, those skilled in the art can envisaged that the method described in this embodiment may also be applicable to a tuning system including, one or more power amplifiers, FIG. 5 is a flowchart of a method applicable to tuning systems in various embodiments according to various embodiments of the present invention. Although the steps of the method are described with reference to the system in FIG. 3 and FIG. 4, it would be appreciated by those skilled in the art that any system configured to perform the steps of the method in any sequence is encompassed in the scope of the present invention.

As shown in FIG. 5, in step 510, a tuning control device determines a plurality of tuning paths and tuning parameters according to the type(s) of one or more power amplifiers. Different tuning parameters can be transmitted on different tuning paths. The tuning paths can include, for example, uplink timing paths and downlink tuning paths corresponding to the one or more power amplifiers. The tuning parameters can include, for example, configuration parameters for configuring the one or more power amplifiers and feedback parameters fed back by the one or more power amplifiers to the tuning control device. The tuning control device can further adjust the configuration parameters according to the received feedback parameters and send the adjusted configuration parameters to the power amplifiers. The adjustment process can be performed once or more times according to user requirements or system configuration requirements.

In step 520, the tuning control device determines data volumes of the tuning parameters and, determines a data volume for each tuning path according to the data volumes of the tuning parameters. Next, in step 530, the tuning control device allocates the number of A2B channels to each tuning path based on the data volume determined for each tuning path. The number of A2B channels required can be allocated proportionally to the various tuning paths of different power amplifiers based on the calculated data volumes of the various tuning paths.

In step 540, the tuning speed of each tuning path for each power amplifier is calculated according to the number of A2B channels allocated to each tuning path. For example, the tuning speed of each tuning path can be equal to the product of the number of channels allocated to the tuning path with the number of bits of each channel and the sampling rate of the A2B bus.

In step 550, the tuning control device allocates the calculated tuning speed of each tuning path for each power amplifier to each power amplifier through the A2B interface.

Figure 6:
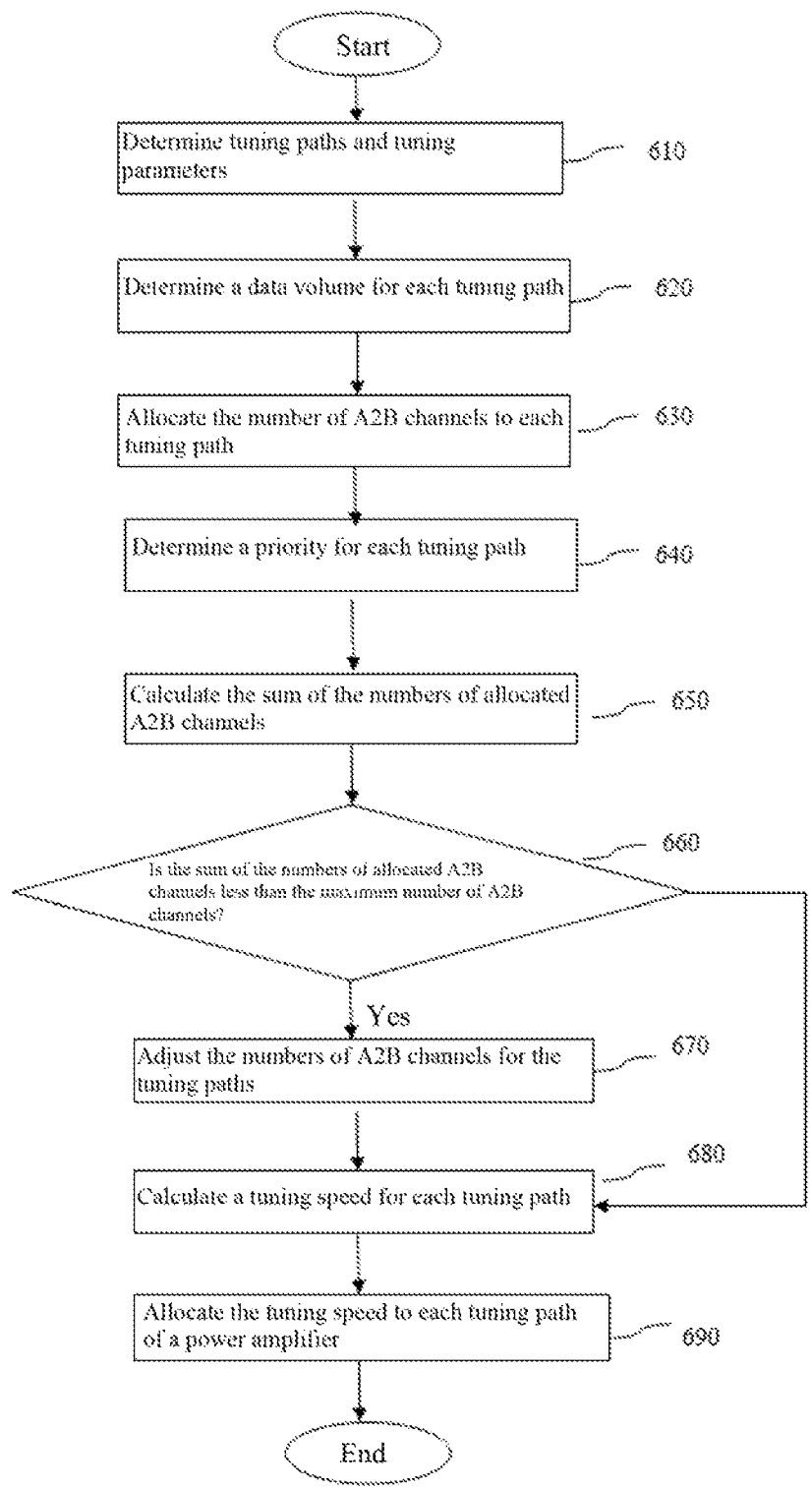
FIG. 6 is another flowchart of a method applicable to a tuning system according to various embodiments of the present invention.

FIG. 6 is a flowchart of a method applicable to tuning systems in various embodiments according to various embodiments of the present invention. Although the steps of the method are described with reference to the system in FIG. 3 and FIG. 4, it would be appreciated by those skilled in the art that any system configured to perform the steps of the method in any sequence is encompassed in the scope of the present invention.

As shown in FIG. 6, similar to the steps of the method shown in FIG. 5, in step 610, a tuning control device determines a plurality of turning paths and tuning parameters according to the type(s) of one or more power amplifiers. In step 620, the tuning control device determines data volumes of the tuning parameters and, determines a data volume for each tuning path according to the data volumes of the turning parameters.

Next, in step 630, the number of A2B channels is allocated to each tuning path based on the data volume determined for each tuning path. The numbers of A2B channels required can be allocated proportionally to various tuning paths of different power amplifiers based on the calculated data volumes of the various tuning paths.

In step 640, priorities are determined for the plurality of tuning paths according to real-time performance requirements of the tuning parameters and the data volumes of the tuning parameters.

In step 650, the sum of the numbers of A2B channels allocated to all the tuning paths is calculated. In step 660, it is judged whether the sum of the numbers of allocated A2B channels is equal to the maximum number of channels of the A2B bus in the tuning system. If the sum of the numbers of allocated A2B channels is less than the maximum number of A2B channels of the A2B bus in the tuning system, the numbers of A2B channels are adjusted in step 670. The adjusting includes calculating the number of unused A2B channels; and adding a part or all of the number of unused A2B channels to the numbers of A2B channels of one or more tuning paths in order of priorities to obtain the adjusted numbers of A2B channels.

In step 680, the tuning speed of each tuning path for each power amplifier is calculated according to the adjusted number of A2B channels fix each tuning path. For example, the tuning speed of each tuning path can be equal to the product of the adjusted number of channels of the tuning path with the number of bits of each channel and the sampling rate.

If it is judged in step 660 that the sum of the numbers of allocated A2B channels is equal to the maximum number of A2B channels of the A2B bus in the tuning system, the numbers of channels are not adjusted, and the method directly proceeds to step 680. In 680, the tuning speed of each tuning path for each power amplifier is calculated according to the number of A2B channels allocated to each tuning path.

Next, in step 690, the calculated tuning speed of each tuning path for each power amplifier is allocated to each power amplifier through the A2B interface.

The tuning control device of the present invention as a whole can be a microprocessor, an application-specific integrated circuit (ASIC), a system on chip (SoC), a mobile computing device (for example, a tablet computer or a mobile phone), a media player, and so on. In general, the tuning control device is configured to coordinate the overall operation of the tuning system. Any technically feasible system configured to implement the functionality of the tuning system is encompassed in the scope of the present invention.

An implementation solution of the present invention may be implemented as a program product for use with a tuning control device. The program of the program product defines functions of the implementation solution (including the method described in this text) and may be included in a variety of computer readable storage media. The illustrative non-transitory computer readable storage medium includes (but not limited to): (i) non-writable storage media on which information is stored permanently (for example, read-only memory devices in a computer, a compact disc-read only memory (CD-ROM) disk that can be read by a CD-ROM drive, a flash memory, a read-only memory (ROM) chip, or any type of solid-state non-volatile semiconductor memories); and (ii) writable storage media on which changeable information is stored (for example, floppy disks in floppy drives or hard drives, or any types of solid state random access semiconductor memories).

The present invention has been described above with reference to specific implementation solutions. However, it would be appreciated by those of ordinary skill in the art that various modifications and changes can be made without departing from the broad spirit and scope of the present invention as stated in the appended claims.

The invention claimed is:

1. A method for power amplifier tuning based on an automobile audio bus (A2B) interface, comprising:
    determining a plurality of tuning paths and a plurality of tuning parameters of one or more power amplifiers;
    determining data volumes of the plurality of tuning parameters according to types of the one or more power amplifiers;
    determining a data volume for each tuning path according to the data volumes of the plurality of tuning parameters;
    allocating the number of A2B channels to each tuning path according to the data volume determined for each tuning path;
    calculating a tuning speed for each tuning path according to the number of A2B channels allocated to each tuning path; and
    allocating the calculated tuning speed for each tuning path to the one or more power amplifiers through the A2B interface.

2. The method of claim 1, wherein allocating, the number of A2B channels to each tuning path further comprises allocating the number of A2B channels to each tuning path proportionally based on the data volume determined for each tuning path.

3. The method of claim 2, further comprising adjusting the number of A2B channels for each tuning path.

4. The method of claim 3, wherein adjusting the number of A2B channels for each tuning path further comprises determining priorities for the plurality of tuning paths according to real-time performance requirements of the plurality of tuning parameters and the data volumes of the plurality of tuning parameters.

5. The method of claim 4, further comprising:
    calculating the sum of the numbers of A2B channels allocated to all the tuning paths; and
    judging whether the resulted sum of the numbers of allocated A2B channels is less than the maximum number of channels of an A2B bus.

6. The method of claim 5, further comprising determining to adjust the numbers of A2B channels if it is judged that the sum of the numbers of allocated A2B channels is less than the maximum number of channels for A2B data transmission.

7. The method of claim 5, further comprising, determining not to adjust the numbers of A2B channels if it is judged that the sum of the numbers of allocated A2B channels is equal to the maximum number of channels for A2B data transmission.

8. The method of claim 6, wherein adjusting the numbers of A2B channels further comprises:
    calculating the number of unused A2B channels; and
    adding a part or all of the number of unused A2B channels to the number of A2B channels of one or more tuning paths in order of priorities to obtain the number of A2B channels allocated to each tuning path.

9. A system for power amplifier tuning based on an automobile audio bus (A2B) interface, comprising:
    a tuning control device;
    one or more power amplifiers; and
    are A2B converter connected between the tuning control device and the one or more power amplifiers,
    wherein the tuning control device is configured to:
    determine a plurality of tuning paths and a plurality of tuning parameters of one or more power amplifiers;
    determine data volumes of the plurality of tuning parameters according to the types of the one or more power amplifiers;
    determine a data volume for each tuning path according to the data volumes of the plurality of tuning parameters;
    allocate the number of A2B channels to each tuning path according to the data volume determined for each tuning path;
    calculate a tuning speed for each tuning path according to the number of A2B channels allocated to each tuning path; and
    allocate the calculated tuning speed for each tuning path to the one or more power amplifiers through the A2B interface.

10. The system of claim 9, wherein the tuning control device is further configured to allocate the number of A2B channels to each tuning path proportionally based on the data volume determined for each tuning path.

11. The system of claim 9, wherein the tuning control device is further configured to adjust the number of A2B channels for each tuning path.

12. The system of claim 11, wherein the tuning control device is further configured to determine priorities for the plurality of tuning paths according to real-time performance requirements of the plurality of tuning parameters and the data volumes of the plurality of tuning parameters.

13. The system of claim 12, wherein the tuning control device is further configured to;
   calculate the sum of the numbers of A2B channels allocated to all the tuning paths; and
   judge whether the calculated sum of the numbers of allocated A2B channels is less than the maximum number of channels for A2B data transmission.

14. The system of claim 13, wherein the tuning control device is further configured to adjust the numbers of A2B channels if it is judged that the sum of the numbers of allocated A2B channels is less than the maximum number of channels for A2B data transmission.

15. The system of claim 13, wherein the tuning control device is further configured to not adjust the numbers of A2B channels if it is judged that the sum of the numbers of allocated A2B channels is equal to the maximum number of channels for A2B data transmission.

16. The system of claim 14, wherein adjusting the numbers of A2B channels comprises:
   calculating the number of unused A2B channels; and
   adding a part or all of the number of unused A2B channels to the number of A2B channels of one or more tuning paths in order of priorities to obtain the number of A2B channels allocated to each tuning path.

\* \* \* \* \*